United States Patent
Lim et al.

(10) Patent No.: US 6,730,614 B1
(45) Date of Patent: May 4, 2004

(54) METHOD OF FORMING A THIN FILM IN A SEMICONDUCTOR DEVICE

(75) Inventors: Jung Wook Lim, Daejon-Shi (KR); Sun Jin Yun, Daejon-Shi (KR); Jin Ho Lee, Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 10/645,671

(22) Filed: Aug. 22, 2003

(30) Foreign Application Priority Data

Nov. 29, 2002 (KR) .......................... 2002-75213

(51) Int. Cl.$^7$ .................. H01L 21/31; H01L 21/44; H01L 21/469
(52) U.S. Cl. .................. 438/763; 438/680; 427/255.28; 427/569
(58) Field of Search .................. 438/763, 680, 438/681, 685; 427/255.28, 569

(56) References Cited

U.S. PATENT DOCUMENTS

| | | | |
|---|---|---|---|
| 6,416,822 B1 | * 7/2002 | Chiang et al. | 427/561 |
| 6,468,924 B2 | 10/2002 | Lee et al. | |
| 6,630,201 B2 | * 10/2003 | Chiang et al. | 427/255.28 |
| 2002/0076507 A1 | * 6/2002 | Chiang et al. | 427/569 |
| 2002/0086476 A1 | * 7/2002 | Kim et al. | 438/200 |
| 2002/0146511 A1 | * 10/2002 | Chiang et al. | 427/248.1 |
| 2002/0187631 A1 | * 12/2002 | Kim et al. | 438/637 |

FOREIGN PATENT DOCUMENTS

KR  2002-46431  6/2002  ......... H01L/29/108

OTHER PUBLICATIONS

Jin–Seong Park, et al.; "Plasma–Enhanced Atomic Layer Deposition of Ta–N Thin Films"; Journal of The Electrochemical Society, 149 (1) C28–C32 (2002).

Hyun–Jung Song, et al.; "Increment of the Dielectric Constant of $Ta_2O_5$ Thn Films by Retarding Interface Oxide Growth on Si Substrates"; Electtrochemica and Solid–State Letters, 4(7) F13–F14 (2001).

* cited by examiner

*Primary Examiner*—Alexander Ghyka
(74) *Attorney, Agent, or Firm*—Jacobson & Holman PLLC

(57) ABSTRACT

The present invention relates to a method of forming a thin film in a semiconductor device. According the method, the thin film is formed by alternately repeating an atomic layer deposition (ALD) method and a plasma enhanced atomic layer deposition (PEALD) method and further by adjusting the ratio of repetition times of the methods, so that it is possible to adjust and estimate the growth rate, density, and material properties such as refraction index, dielectric constant, electric resistance, etc.

9 Claims, 3 Drawing Sheets

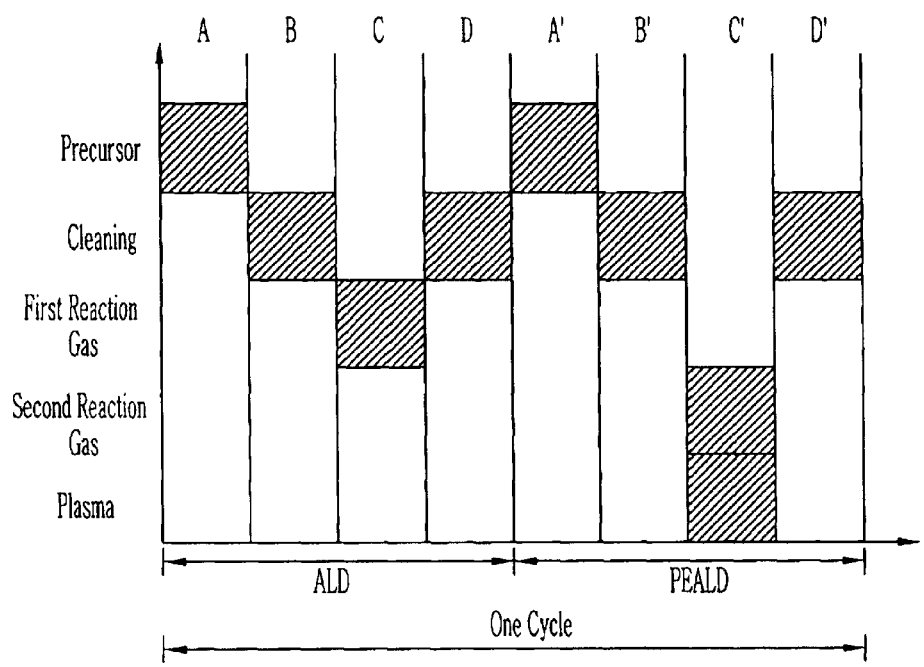
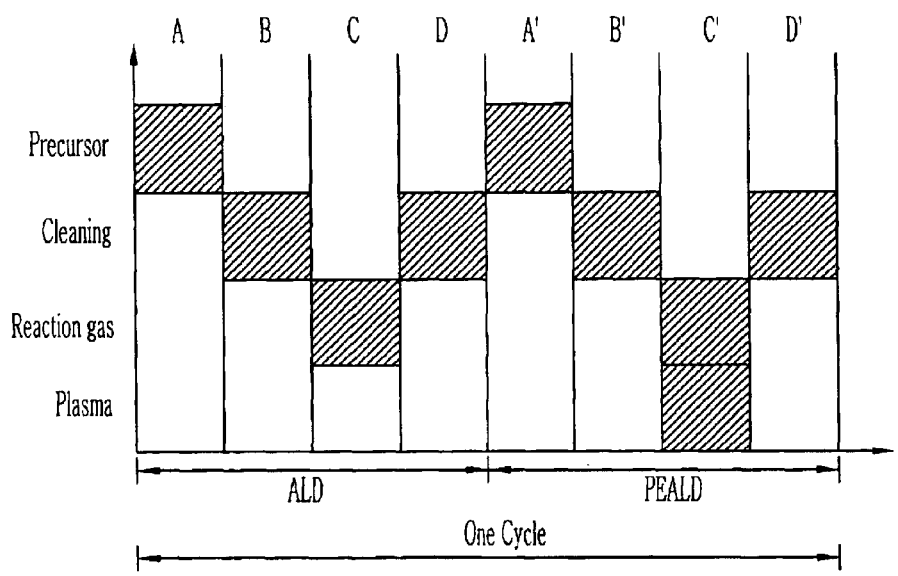

METHOD OF FORMING A THIN FILM IN A SEMICONDUCTOR DEVICE

BACKGROUND OF THE INVENTION

1. Field of the Invention

The invention relates to method of formning a thin film in a semiconductor device, and more particularly, to method of forming a thin film in a semiconductor device capable of controlling the growth rate, thickness, density, and other material properties of the thin film.

2. Description of the Prior Art

As semiconductor devices are highly integrated, developments of processes of forming a thin film utilized in a semiconductor or a display device have been focused on processes for producing thinner films having more excellent material properties. To meet these circumstances, an atomic layer deposition method (hereinafter, referred to as an ALD method) has been highlighted. The ALD method has advantages that atomic layers can be uniformly deposited on wide substrates, the thickness of the thin film corresponding to repetition times of the process can be controlled, and step coverage is good (Applied Surface Science, 107, pp128 (1996), and Journal of the Electrochemical Society, 149(6), pp C306 (2002)). In addition, the atomic layer deposition process can be carried out below precursor dissociation temperature, so that a low-temperature process can be accommodated, and the process can be less sensitive to the process parameters such as temperature, pressure, etc. Furthermore, according to the ALD method, a thin film having excellent crystalline properties can be obtained.

However, the atomic layer deposition method has some disadvantages. For example, precursors and reaction gases have to be separately supplied. Furthermore, an additional purging step for cleaning the inside of a chamber is needed before supplying the precursors or the reaction gases to the chamber. Therefore, a process period may be extended because the above additional steps have to be repeated in every cycle until a desired thickness is obtained. In addition, a reaction rate between the precursor and the reaction gas needs to be increased to broaden a reaction temperature range because the temperature of reaction between the precursor and the reaction gas should be in a low temperature range.

In order to solve the above problems, an atomic layer deposition method together with a plasma applying method (hereinafter, referred to as a PEALD method) has been developed. Maintaining the advantages of the ALD method, the plasma enhanced atomic layer deposition method has additional advantages that a process period can be shortened due to improved deposition rate, and a process temperature range can be broadened due to improved reactivity of the reaction gas. Furthermore, the thin film with a higher density can be obtained.

According to several researches, it has been reported that, when the oxidized substance like $Al_2O_3$ is deposited in a temperature of 200° C., the growth rate of the thin film deposited by the plasma enhanced atomic layer deposition method is 1.5 times higher than that of an atomic layer deposition method, and the density is also excellent. Other reports also have shown that, when the thin film comprising $Ta_2O_5$ is deposited, the plasma enhanced atomic layer deposition method provides higher dielectric constant and better electrical insulation properties than those of the conventional method (Electrochemical and Solid-state Letters, 4(7), pp F13(2001)).

While it is believed that differences in the growth rates or densities of the thin films are derived from the types of the deposition mechanism and the film deposition method.

SUMMARY OF THE INVENTION

It is an object of the present invention to provide a method of forming a thin film in a semiconductor device by alternately performing the ALD method and the PEALD method while adjusting the ratio of repetition times of the methods, so that the growth rate, density, and related material properties such as refraction index, dielectric constant, electric resistance, etc. can be estimated and controlled.

A method of forming a thin film in a semiconductor device according to an embodiment of the present invention comprises steps of: performing only one cycle of an atomic layer deposition method to form the thin film having a basic unit thickness on upper portion of a substrate; and performing only one cycle of a plasma enhanced atomic layer deposition method to form the thin film having the basic unit thickness on the upper portion of the substrate, wherein the steps are alternately repeated to form the thin film having a desired thickness.

In the aforementioned method, the ratio of repetition times of the atomic layer deposition method and the plasma enhanced atomic layer deposition method may be adjusted to be N:M, thereby controlling the growth rate and material properties of the thin film, where N and M are integer numbers.

In the aforementioned method, the plasma enhanced atomic layer deposition method and the atomic layer deposition method may use different precursors and different reaction gases as well as the same precursors and reaction gases.

BRIEF DESCRIPTION OF THE DRAWINGS

The aforementioned aspects and other features of the present invention will be explained in the following description, taken in conjunction with the accompanying drawings, wherein:

FIG. 1 is a recipe diagram for explaining a method of forming a thin film in a semiconductor device according to a first embodiment of the present invention.

FIG. 2 is a recipe diagram for explaining a method of forming a thin film in a semiconductor device according to a second embodiment of the present invention.

DETAILED DESCRIPTION OF PREFERRED EMBODIMENTS

Figure 3:
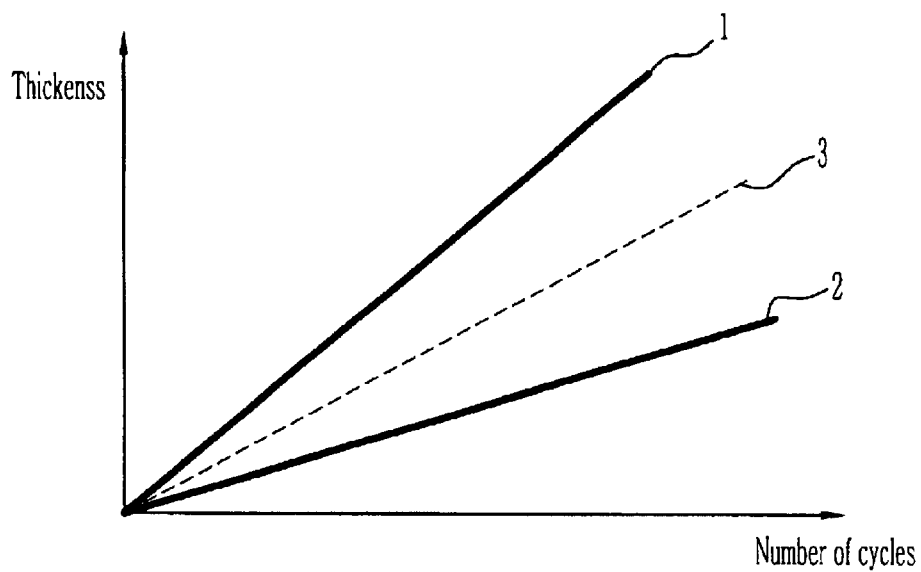
FIG. 3 is a characteristic graph for comparing growth rates according to the methods of forming a thin film.

The present invention will be described in detail by way of preferred embodiments with reference to accompanying drawings. However, the present invention is not limited by the disclosed embodiment, and a variety of modifications could be implemented. The following embodiments are provided to disclose the entirety of the present invention, and to make the ordinary skilled in the art fully understand the scope of the present invention. In addition, similar reference numerals are used to identify the similar parts.

FIG. 1 is a recipe diagram for explaining a method of forming a thin film in a semiconductor device according to a first embodiment of the present invention, and FIG. 2 is a recipe diagram for explaining a method of forming a thin film in a semiconductor device according to a second embodiment of the present invention.

Referring to FIG. 1, in a method of forming a thin film in a semiconductor device according to a first embodiment of the present invention, the thin film is formed by alternately performing the atomic layer deposition method and the plasma enhanced atomic layer deposition method.

The ALD method is performed by repeatedly proceeding the following steps as one cycle: a first step (A) of supplying precursors into a deposition chamber to absorb the precursors on the surface of a substrate; a second step (B) of removing the remaining precursors that are not absorbed on the substrate for cleaning; a third step (C) of supplying a first reaction gas and making it react with the precursors to form an atomic layer thin film; and a fourth step (D) of removing the first gas that does not react with the precursor and by-products of the reaction for cleaning.

The PEALD method is performed by repeatedly proceeding the following steps as one cycle: a first steps (A') of supplying precursors into a deposition chamber to absorb the precursors on the surface of a substrate; a second step (B') of removing the remaining precursors that are not absorbed on the substrate for cleaning; a third step (C') of supplying a second reaction gas while generating plasma and making it react with the precursors to form an atomic layer thin film; and a fourth step (D) of removing the second reaction gas that does not react with the precursor and by-products of the reaction for cleaning.

On the other hand, in another embodiment, the same reaction gas may be supplied to the chamber for the ALD method and the PEALD method as depicted in FIG. 2, although different reaction gases may be supplied in the aforementioned embodiment.

According to the above preferred embodiments, one cycle which is needed to form a minimal unit thin film consists of eight steps A to D and A' to D'. In consideration of the discontinuity of the growth rate and the difference of the material properties between ALD method and the PEALD method, the growth rate and material properties of the thin film can be controlled by adjusting the ratio of repetition times of the ALD method and the PEALD method. By doing so, the present embodiment has advantages that the thickness or material properties of the same thin film can be controlled and precisely estimated. Additionally, the observation that the variation of the density accompanies the corresponding variation of impurity concentration and lattice vacancy will be helpful for the related studies and provide the clues for clarifying the deposition mechanism of the PEALD and ALD methods.

FIG. 3 is a characteristic graph for comparing growth rates according to the methods of forming a thin film.

Referring to FIG. 3, a straight line 1 is a graph for showing thickness relation according to repetition times in case of forming a thin film at an arbitrary temperature by only the PEALD method, and a straight line 2 is a graph for showing thickness relation according to repetition times in case of forming a thin film at a predetermined temperature by only the ALD method. If the thin film is formed by alternately performing the ALD method and the PEALD method at a ratio of 1 to 1, a straight line 3 is a graph for showing the thickness relation according to repetition times.

Figure 4:
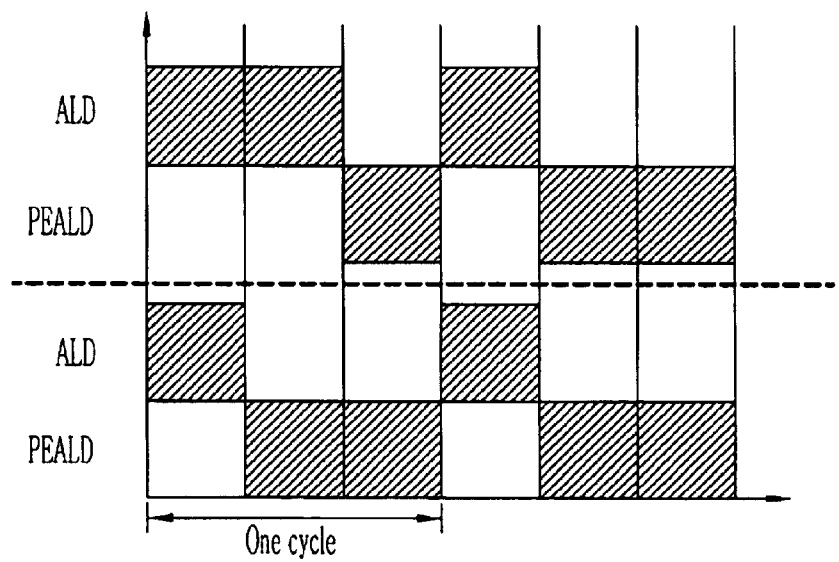
FIG. 4 is a recipe diagram for explaining a method of forming a thin film in a semiconductor device according to a third embodiment of the present invention.
Figure 5:
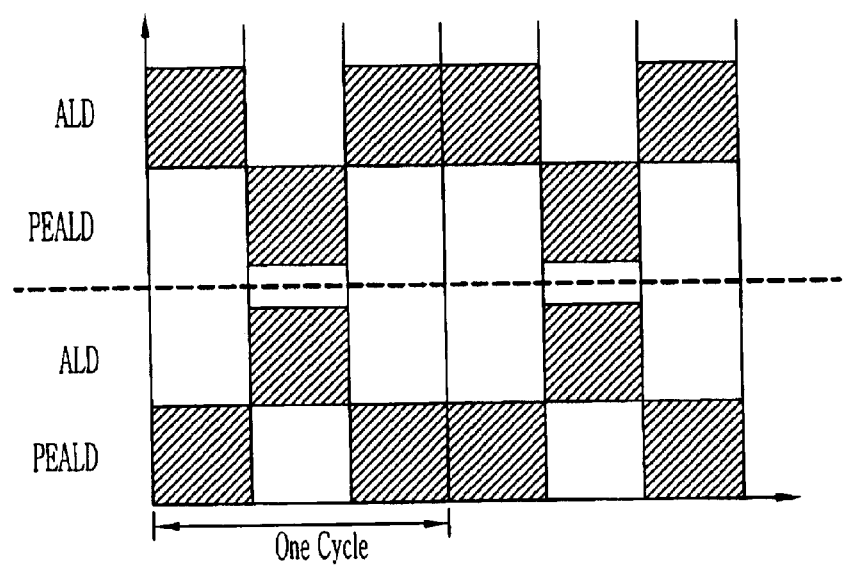
FIG. 5 is a recipe diagram for explaining a method of forming a thin film in a semiconductor device according to a fourth embodiment of the present invention.

FIG. 4 is a recipe diagram for explaining a method of forming a thin film in a semiconductor device according to a third embodiment of the present invention, and FIG. 5 is a recipe diagram for explaining a method of forming a thin film in a semiconductor device according to a fourth embodiment of the present invention.

Referring to FIGS. 4 and 5, the thin film can be formed by repeatedly performing the ALD method and the PEALD method at a ratio of 2:1 or 1:2. If the ratio of performing the ALD method and the PEALD method is adjusted as 2:1 or 1:2, the straight line 3 will be shifted to the straight lines 1 and 3, as shown in FIG. 3. Here, the ratio of repetition times of the methods can be further adjusted depending on the desired material, properties and thickness, or can be arbitrarily adjusted. Such results indicate that the present invention maintains the feature of the ALD method that the thickness is proportional to the number of cycles.

On the other hand, even though the same ratio of 2:1 is used, the sequence of the methods can be differently arranged as shown in FIG. 4 and FIG. 5, and similarly even though the same ratio of 1:2 is used, the sequence of the methods can be differently arranged as shown in FIG. 4 and FIG. 5. If the sequence is differently arranged at the same ratios like these, the physical properties of the thin films can be slightly influenced. Therefore, such arrangement can be adjusted depending on the desired physical properties. Like this, if the thin film is formed by alternately performing the ALD method and the PEALD method, it is possible to obtain the intermediate, higher, or lower value of the growth rates and other physical properties of the thin films formed by only the ALD method and only the PEALD method. Furthermore, if the performing ratio is adjusted, the growth rate and physical properties can be adjusted suitable for the purpose.

For an experimental example, when an $Al_2O_3$ thin film is formed in a temperature of 250° C., the growth rate of the PEALD method is higher than that of the ALD method. And, in case that the thin film is formed by repeatedly performing the ALD method and the PEALD method at a ratio of 1:1, the growth rate corresponds to the intermediate value of those of the cases formed by only the ALD method and by only the PEALD method. Here, $H_2O$ is applied for the reaction gas in case of the ALD method, and oxygen plasma is applied as a reaction gas in case of the PEALD method. As a result, the differences of the reaction mechanisms have influences on the distribution of the absorption sites, and thus variation in the density of the thin film occurs. However, in case that the thin film is formed by alternately performing the methods, the distribution of the absorption sites appears to be mixed. In case that the ratio of mixing is adjusted and changed, the absorption and reaction sites also appear to continuously changed.

In case of an oxide thin film, it is possible to obtain the denser thin film having a high dielectric breakdown voltage as well as the improved growth rate when the atomic layer deposition method is performed with the plasma being applied.

Figure 6:
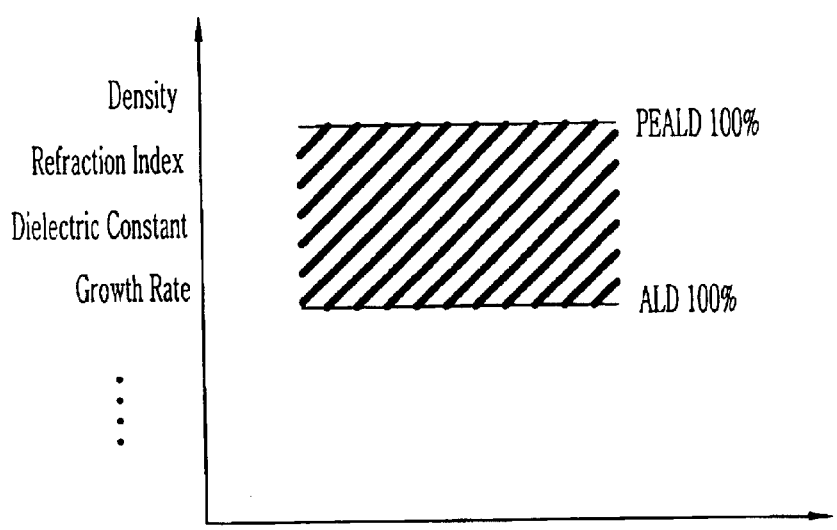
FIG. 6 is a characteristic graph for comparing physical properties according to the method of forming a thin film.

FIG. 6 is a characteristic graph for comparing physical properties according to the methods of forming a thin film.

Referring to FIG. 6, since the densities of the thin film as well as the growth rates and the related physical properties such as refraction index, dielectric constant, electric resistance, etc. are different between the ALD method and the PEALD method, it is noted that it is possible to implement the continuous variation of the values between the above values by adjusting the ratio of mixing. In addition, it is possible to ensure reliability and reproducibility of the process for forming the thin film having the desired material properties by these methods.

Thereafter, a method of forming a thin film in a semiconductor device according to a fifth embodiment of the present invention.

The ALD method is performed by repeatedly proceeding the following steps as one cycle: a first step (A) of supplying precursors into a deposition chamber to absorb the precursors on the surface of a substrate; a second step (B) of removing the remaining precursors that are not absorbed on the substrate for cleaning; a third step (C) of supplying a first reaction gas and making it react with the precursors to form an atomic layer thin film; and a fourth step (D) of removing the first gas that does not react with the precursor and by-products of the reaction for cleaning.

In this ALD process, only the PEALD step of supplying reaction gases while generating plasma and making it react with the precursors to form an atomic layer thin film may be included between the third step (C) and the fourth step (D), or after the fourth step (D). In case the PEALD step of supplying reaction gases (same to or different from reaction gases of ALD) is included after the fourth step (D), an additional purge step(removing the gases that does not react with the precursor and by-products of the reaction for cleaning) may be included. Especially, in case reaction speed with precursors and reaction is relatively low, the PEALD step of supplying reaction gases is, preferably, included between the third step (C) and the fourth step (D). The conventional atomic layer deposition has a shortcoming that a total process time may be lengthened due to increment of the cycle time. However, the embodiment may shorten the total process time.

In the fields of thin film transistor (TFT) for flexible display, plastic substrate is used and inorganic film is deposited on it. If slightly high thermal energy is provided, the deformation of substrates happens due to the considerable difference of thermal expansion coefficients between substrates and inorganic thin films.

In the growth of films by PEALD, extra thermal energy added by plasma may result in the deformation of substrates, while there is no deformation of substrates when films are grown by ALD. The difference of film density and other properties such as electrical properties (breakdown fields, dielectric constant and etc.) between films by PEALD and by ALD, however, increases severely with the decrease of deposition temperature below 200° C. Therefore, it is required that thin film meeting with both contradictory conditions should be fabricated. Hence, the mixing method with ALD and PEALD should be performed in the fabrication of thin films in flexible display.

As described above, according to the present invention, the thin film is formed by alternately performing the ALD method and the PEALD method and by adjusting the ratio of repetition times, so that the growth rate, density, and related material properties such as refraction index, dielectric constant, electric resistance, etc. can be estimated and controlled. Consequently, it is possible to ensure the reliability and reproducibility of the process.

What is claimed is:

1. A method of forming a thin film in a semiconductor device comprising steps of:
   performing one cycle of an atomic layer deposition method to form the thin film having a basic unit thickness on an upper portion of a substrate; and
   performing one cycle of a plasma enhanced atomic layer deposition method to form the thin film having a basic unit thickness on the upper portion of the substrate,
   wherein the steps are repeated to form the thin film having a desired thickness.

2. The method according to claim 1, wherein the ratio of repetition times of the atomic layer deposition method and the plasma enhanced atomic layer deposition method is adjusted to be N:M, thereby controlling the growth rate and material properties of the thin film, wherein N and M are integer numbers.

3. The method according to claim 1, wherein the plasma enhanced atomic layer deposition method and the atomic layer deposition method use different reaction gases.

4. The method according to claim 1, wherein the plasma enhanced atomic layer deposition method and the atomic layer deposition method use different precursors.

5. The method according to claim 1, the one cycle of an atomic layer deposition includes: a first step (A) of supplying precursors into a deposition chamber to absorb the precursors on the surface of a substrate; a second step (B) of removing the remaining precursors that are not absorbed on the substrate for cleaning; a third step (C) of supplying a first reaction gas and making it react with the precursors to form an atomic layer thin film; and a fourth step (D) of removing the first gas that does not react with the precursor and by-products of the reaction for cleaning.

6. The method according to claim 1, wherein the steps are alternatively repeated to form the thin film having a desired thickness.

7. The method according to claim 1, wherein the substrate is flexible type.

8. A method of forming a thin film in a semiconductor device comprising steps of:
   (a) supplying precursors into a deposition chamber to absorb the precursors on the surface of a substrate;
   (b) removing the remaining precursors that are not absorbed on the substrate for cleaning;
   (c) supplying a first reaction gas and making it react with the precursors to form an atomic layer thin film; and
   (d) removing the first gas that does not react with the precursor and by-products of the reaction for cleaning,
   wherein the PEALD step of supplying reaction gases is included between the step (C) and the step (D), or after the step (D).

9. The method according to claim 1, an additional purge step is performed after the step (D).

* * * * *